(12) United States Patent
Chung et al.

(10) Patent No.: US 7,208,800 B2
(45) Date of Patent: Apr. 24, 2007

(54) SILICON-ON-INSULATOR SUBSTRATE, FABRICATING METHOD THEREOF, AND METHOD FOR FABRICATING FLOATING STRUCTURE USING THE SAME

(75) Inventors: Seok-whan Chung, Suwon-si (KR); Hyung Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/242,824

(22) Filed: Oct. 5, 2005

(65) Prior Publication Data
US 2006/0081929 A1 Apr. 20, 2006

(30) Foreign Application Priority Data
Oct. 20, 2004 (KR) ............... 10-2004-0083855

(51) Int. Cl.
H01L 21/84 (2006.01)
H01L 27/12 (2006.01)
(52) U.S. Cl. ............... 257/347; 257/618; 257/E21.094; 438/149; 438/479
(58) Field of Classification Search ........... 257/347, 257/52, 618, E21.094; 438/149, 977, 479, 438/481
See application file for complete search history.

(56) References Cited

U.S. PATENT DOCUMENTS

| | | | | |
|---|---|---|---|---|
| 5,298,449 A * | 3/1994 | Kikuchi | ............... | 438/459 |
| 5,493,470 A | 2/1996 | Zavracky et al. | | |
| 6,287,885 B1 * | 9/2001 | Muto et al. | ............... | 438/48 |
| 6,657,258 B2 * | 12/2003 | Bae | ............... | 257/347 |
| 6,755,982 B2 * | 6/2004 | Lin | ............... | 216/2 |
| 6,916,728 B2 * | 7/2005 | Gogoi et al. | ............... | 438/481 |
| 6,979,873 B2 * | 12/2005 | Fujii | ............... | 257/417 |
| 2004/0121564 A1 | 6/2004 | Gogoi | | |

FOREIGN PATENT DOCUMENTS

| | | | |
|---|---|---|---|
| EP | 0 325 885 A2 | | 8/1989 |
| JP | 05-234884 | * | 9/1993 |
| JP | 5-234884 A | | 9/1993 |

OTHER PUBLICATIONS

Howe R T: "Siliconmicrodynamic Systems-Recent Developments in Microactuatiorsand Micromachinery", Wescon Technical Papers, Wester Periodicals Co. North Hollywood, US, vol. 33, Nov. 1, 1989, pp. 202-205, XP000116005.

* cited by examiner

*Primary Examiner*—T. N. Quach
(74) *Attorney, Agent, or Firm*—Sughrue Mion, PLLC

(57) ABSTRACT

A silicon-on-insulator (SOI) substrate including laminated layers of a substrate, an oxide layer, and a silicon layer in order. The oxide layer has an electrifying hole fluidly connected with the substrate and the electrifying hole is filled with a part of the silicon layer. A method for fabricating the floating structure is also disclosed which includes the steps of forming an oxide layer having a predetermined thickness on a substrate, forming one or more electrifying holes in an area of the oxide layer corresponding to an inner part of the floating structure, forming a silicon layer on the oxide layer including an electrification structure electrically connecting the silicon layer to the substrate, forming a pattern for the floating structure on the silicon layer, removing the oxide layer corresponding to an inner area of the pattern, forming a thermal oxide layer on a surface of the silicon layer, and removing the thermal oxide layer to form the floating structure.

15 Claims, 5 Drawing Sheets

US 7,208,800 B2

SILICON-ON-INSULATOR SUBSTRATE, FABRICATING METHOD THEREOF, AND METHOD FOR FABRICATING FLOATING STRUCTURE USING THE SAME

CROSS-REFERENCE TO RELATED APPLICATIONS

This application claims benefit under 35 U.S.C. § 119(a) of Korean Patent Application No. 2004-83855, filed Oct. 20, 2004, the entire contents of which are incorporated herein by reference.

BACKGROUND OF THE INVENTION

1. Field of the Invention

The present invention relates to a silicon-on-insulator (SOI) substrate, a fabricating method thereof, and a method for fabricating a floating structure using the same.

2. Description of the Related Art

Recently, high-speed chip fabrication technology using a silicon-on-insulator (SOI) substrate has made rapid progress in the area of semiconductor processing technology with respect to fabrication of high-integration memory over 1G DRAM and a high-performance microprocessor. According to SOI technology, an insulation film is coated on a silicon substrate which is an element of a semiconductor and a silicon thin film is formed thereon to prevent electron leakage and enhance integration level. Therefore, SOI technology is used in superfine processing.

Among SOI technologies, a silicon-on-sapphire (SOS) technology of forming silicon (Si) on a single-crystal sapphire substrate by heteroepitaxial chemical vapor deposition (CVD) is well known as an advanced technique. Nevertheless, it is difficult to put SOI technology to practical use due to several problems. For example, many crystalline imperfections are generated by lattice mismatch at an interface between the Si layer and the sapphire substrate, aluminum constituting the sapphire substrate mixes into the Si layer, the substrate is expensive, and large-area substrates are difficult to implement.

Recently, there have been attempts to achieve a SOI structure without use of a sapphire substrate. The attempts mainly include two methods.

The first method involves oxidizing a surface of the Si single-crystal substrate and forming a window in the oxide layer to partly expose the Si substrate. The Si single-crystal is horizontally and epitaxially grown using the exposed portion as a seed to form a Si single-crystal layer on the oxide layer.

The second method uses a Si single-crystal substrate as an activator layer and forms an oxide layer thereunder. This technique may be achieved by bonding a single-crystal Si substrate onto a dedicated single-crystal Si substrate which is thermally oxidized by heat treatment or by use of an adhesive, thereby implementing a SOI structure.

FIG. 1 is a sectional view showing a conventional SOI substrate in which an etching hole is formed in a reactive ion etching chamber. FIG. 2 is an enlarged view of a part "I" of FIG. 1.

Referring to FIGS. 1 and 2, SOI substrate 10 comprises a lower silicon substrate 11, an oxide layer 13 and a silicon layer 15 laminated in order.

The silicon layer 15 has an etching hole 15a for obtaining a predetermined pattern using an etching device. For example, a reactive ion etching (RIE) device may be used as the etching device.

Such an etching device has upper and lower electrodes 23 and 25 arranged in a processing chamber 21, and the SOI substrate 10 is set on the lower electrode 23. A gas plasma is induced by applying a high-frequency voltage to one of the upper and the lower electrodes 23 and 25 and supplying a reactive gas to the processing chamber 21. A plasma ion, accelerated by an electric field generated between the upper and the lower electrodes 23 and 25 and passing through a hole of a resistance mask (not shown), forms the etching hole 15a by contacting the exposed portion of the silicon 15.

However, during the etching process, the silicon substrate 11 and the silicon layer 15 are electrically isolated by the insulating oxide layer 13, possibly causing a notch N when forming a deep etching hole by partly exposing the oxide layer 13. This is because an electric charge is focused on an interface between the etching hole 15a and the oxide layer 13.

SUMMARY OF THE INVENTION

An object of the present invention is to solve at least the above problems and/or disadvantages of the prior art and to provide at least the advantages described below. Accordingly, an object of the present invention is to provide a silicon-on-insulator (SOI) substrate comprising an electrifying hole in said oxide layer, the electrifying hole being filed with a part of the silicon layer and connecting to the substrate, capable of preventing generation of a notch when performing deep-etching in a silicon layer, by constructing an insulator layer (oxide layer) of the SOI substrate chargeable with electricity.

A second object of the present invention is to provide a method for fabricating the SOI substrate described above.

A third object of the present invention is to provide a method for fabricating a floating structure using the above SOI substrate.

The above-described objects of the present invention have been achieved by providing a silicon-on-insulator (SOI) substrate comprising a substrate, an oxide layer formed on the substrate, and a silicon layer formed on the oxide layer in electrical connection with the substrate so as to prevent a notch from being generated when deep etching a pattern in the silicon layer.

The SOI substrate preferably comprises an electrifying hole in said oxide layer, the electrifying hole being filled with a part of the silicon layer and connecting to the substrate.

According to a second embodiment, the present invention provides a method for fabricating an SOI substrate, comprising the steps of forming an oxide layer on a substrate, and forming a silicon layer on the oxide layer including an electrification structure connecting the silicon layer to the substrate.

The silicon layer forming step preferably comprises a step of exposing a part of the substrate to form an electrifying hole and filling the electrifying hole with a part of the silicon layer to form said electrification structure.

The electrifying hole is preferably formed by dry etching. More preferably, the electrifying hole is formed by reactive ion etching.

According to a third embodiment, the present invention provides a method for fabricating a floating structure using an SOI substrate, comprising the steps of depositing an oxide layer on a substrate in a predetermined thickness, forming a silicon layer on the oxide layer including an electrification structure electrically connecting the silicon layer to the substrate, forming a pattern for the floating structure having an inner area on the silicon layer, removing the oxide layer corresponding to the inner area of the pattern, forming a second oxide layer (which may be a thermal oxide layer) on a surface of the silicon layer, and removing the second oxide layer to form said floating structure.

The silicon layer forming step preferably comprises exposing a part of the substrate to form an electrifying hole and filling the electrifying hole with a part of the silicon layer to form said electrification structure.

The electrifying hole is preferably formed within an area for the floating structure. The electrifying hole is also preferably formed by dry etching. More preferably, the dry etching comprises reactive ion etching.

In the pattern forming step, the pattern is preferably formed by deep reactive ion etching.

In the step of removing the oxide layer corresponding to the inner area of the pattern, the oxide layer is preferably removed by wet etching.

In the step of forming the second oxide layer, the second oxide layer is preferably formed by oxidation.

In the step of forming the floating structure by removing the second oxide layer, the second oxide layer is preferably removed by wet etching.

The floating structure fabricated as described above can be applied for use in a micro electro mechanical system (MEMS) structure such as a gyroscope, an optical mirror and a radio frequency (RF) switch.

As can be appreciated from the above description, the SOI substrate is constructed in such manner that the substrate and the silicon layer can be electrified, and the silicon layer is patterned so that the underlying oxide layer is partly exposed. Consequently, this technique prevents generation of a notch at a lower part of the pattern in contact with the oxide layer.

The etching characteristic of the floating structure can be improved by using the SOI substrate. Therefore, a floating structure satisfying desired design parameters can be fabricated.

BRIEF DESCRIPTION OF THE DRAWINGS

The above aspect and other features of the present invention will become more apparent by the following detailed description of exemplary embodiments thereof with reference to the attached drawing figures, in which.

DETAILED DESCRIPTION OF THE PREFERRED EMBODIMENTS

Figure 1:
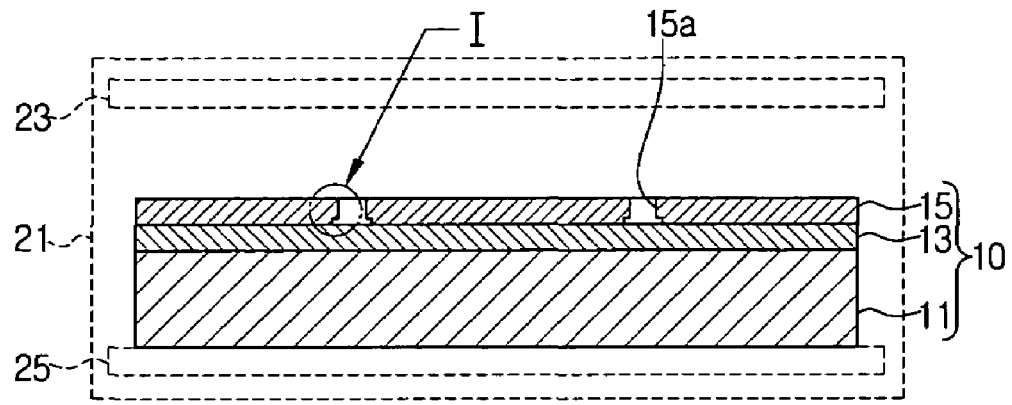
FIG. 1 is a sectional view showing a conventional silicon-on-insulator (SOI) substrate in which an etching hole is formed.
Figure 2:
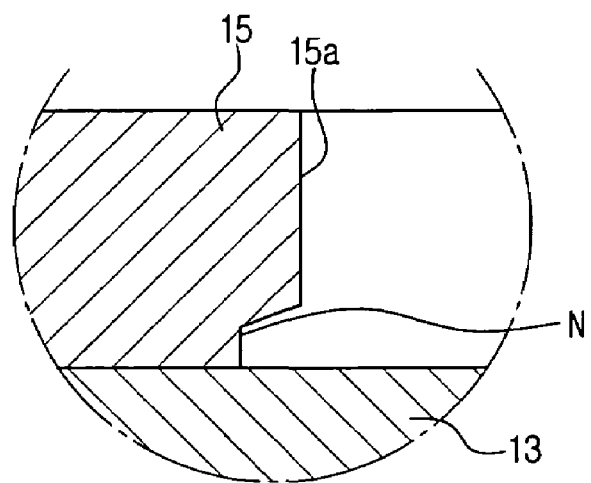
FIG. 2 is an enlarged view of a part "I" of FIG. 1

Hereinafter, an embodiment of the present invention will be described in detail with reference to the accompanying drawing figures. However, the present invention should not be construed as being limited thereto.

In the following description, the same drawing reference numerals are used for the same elements in different drawings. The following detailed description of construction and elements is provided to assist in a comprehensive understanding of the invention. Thus, it is apparent that the present invention can be carried out in various embodiments without being limited thereto. Also, well-known functions or constructions are not described in detail since they would obscure the invention in unnecessary detail.

Figure 3:
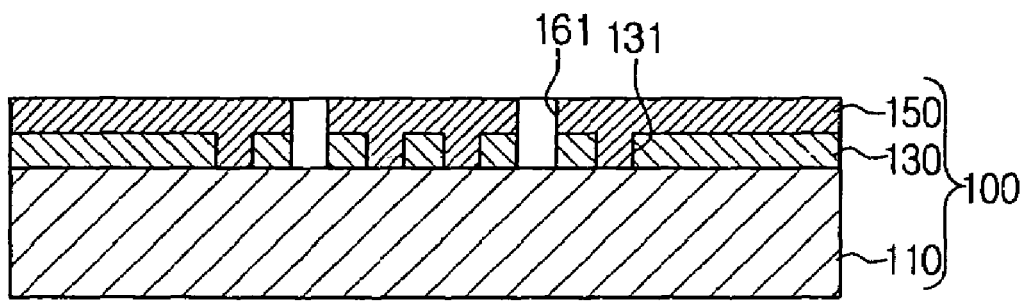
FIG. 3 is a longitudinal sectional view showing the structure of an SOI substrate according to an embodiment of the present invention.

FIG. 3 is a longitudinal sectional view showing the structure of an SOI substrate according to an embodiment of the present invention.

Referring to FIG. 3, silicon-on-insulator (SOI) substrate 100 comprises a laminate of an insulating oxide layer 130 formed on a silicon substrate 110, and a silicon layer 150 formed on the oxide layer 130.

The oxide layer 130 has a plurality of electrifying holes 131 fluidly connecting the silicon layer 150 and the silicon substrate 110. The electrifying holes 131 are formed by dry etching, more preferably by reactive ion etching (RIE).

The presence of electrifying holes 131 enables electrical connection between the silicon layer 150 and the silicon substrate 110. This prevents generation of a notch due to concentration of electric charge on a lower part of the etching pattern 161 contacting the oxide layer 130, when forming a deep-etching pattern 161 in the silicon layer 150.

Figure 4:
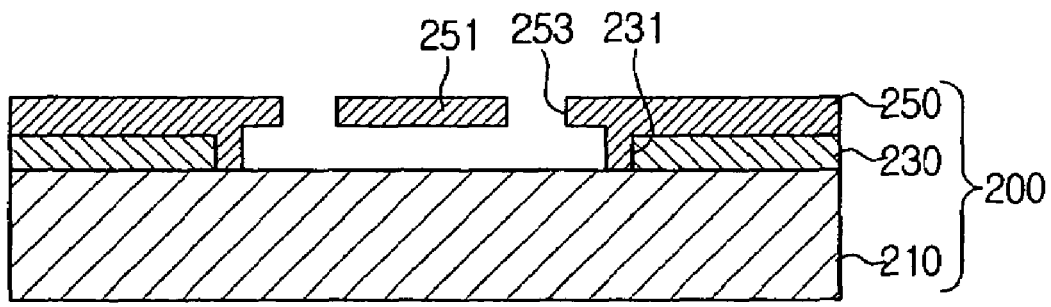
FIG. 4 is a longitudinal sectional view showing a floating structure formed using the SOI substrate of FIG. 3.

FIG. 4 is a longitudinal sectional view which shows a floating structure formed using the SOI substrate of FIG. 3.

Referring to FIG. 4, in the same manner as in FIG. 3, the SOI substrate 200 is a laminate of a silicon substrate 210, an oxide layer 230 and a silicon layer 250, in order. The silicon layer 250 is electrically connected to the silicon substrate 210 by means of the electrifying hole 231. Full details of the structure will be given below with reference to FIGS. 6A to 6G.

By etching a pattern 253 and filling the same so as to electrically connect the silicon layer 250 and the silicon substrate 210, the formation of a notch can be prevented. Such a notch is otherwise generated due to concentration of electric charge at an interface between a lower part of the etching pattern 253 and the oxide layer 230. Accordingly, a floating structure 251 satisfying various design parameters can be obtained.

FIGS. 5A through 5D are views illustrating processes for fabricating the SOI substrate of FIG. 3.

Figure 5A:
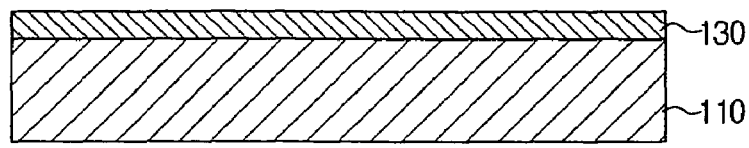
FIGS. 5A through 5D are views illustrating processes for fabricating the SOI substrate of FIG. 3.

Referring to FIG. 5A, an oxide layer 130 made of an insulating material (e.g., silicon dioxide) is formed or grown on a surface of the silicon substrate 110.

Figure 5B:
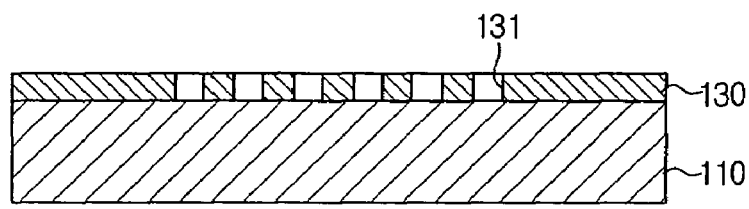

As shown in FIG. 5B, a predetermined electrifying hole 131 is formed in the oxide layer 130. The electrifying hole 131 is formed by a dry etching technique such as reactive ion etching, preferably as a micro hole.

Figure 5C:
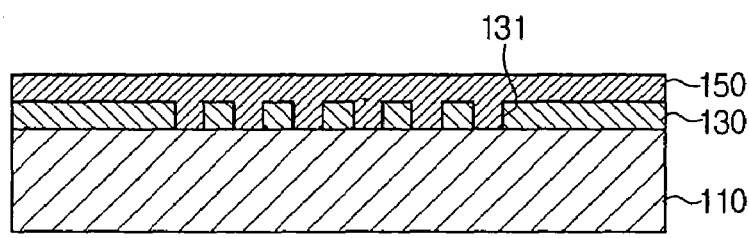

In FIG. 5C, silicon layer 150 is formed on the oxide layer 130 having the electrifying hole 131, in such manner that the silicon layer 150 and the silicon substrate 110 are fluidly connected through the electrifying hole 131. Accordingly, the silicon layer 150 and the silicon substrate 110 can be electrically charged.

Figure 5D:
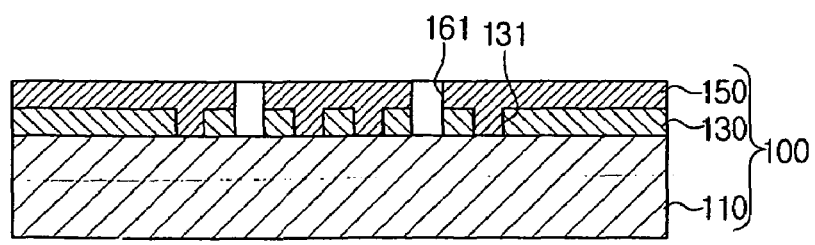

Therefore, when a pattern 161 is deep-etched through the silicon layer 150 and the oxide layer 130 as shown in FIG. 5D, formation of a notch can be prevented, which is otherwise generated due to concentration of electric charge on a lower part of the etching pattern 161 in contact with the oxide layer 130. Quantity of the deep etching herein corresponds to thickness of the silicon layer 150 in the SOI substrate specification. For example, if thickness of the silicon layer 150 is 40 µm, thickness of the oxide layer 130 is 20 μm, and thickness of the silicon substrate 110 is 500 μm in the SOI substrate specification, the quantity of deep etching is 40 μm. Thus, the quantity of deep etching may vary according to the SOI substrate specification.

FIGS. 6A through 6G are views illustrating processes for fabricating the structure of FIG. 4.

Figure 6A:
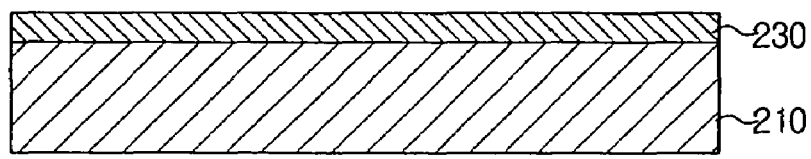
FIGS. 6A through 6G are views illustrating processes for fabricating the structure of FIG. 4.

Referring to FIG. 6A, an oxide layer 230 as an insulator layer is formed on the silicon substrate 210 in a predetermined thickness.

Figure 6B:
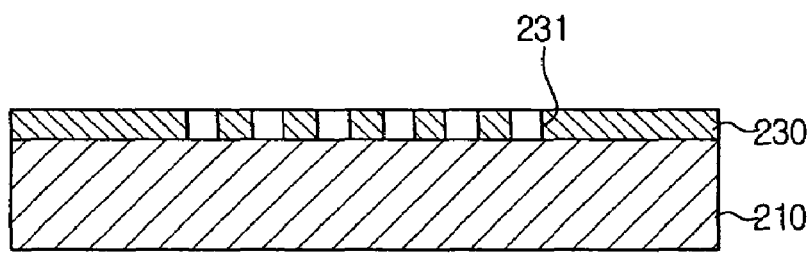

Referring to FIG. 6B, a predetermined electrifying hole 231 is formed in the oxide layer 230. The electrifying hole 231 is formed by a dry etching technique such as reactive ion etching in an area for the floating structure 251 which will be described below. The electrifying hole 231 is provided in the form of a micro hole.

Figure 6C:
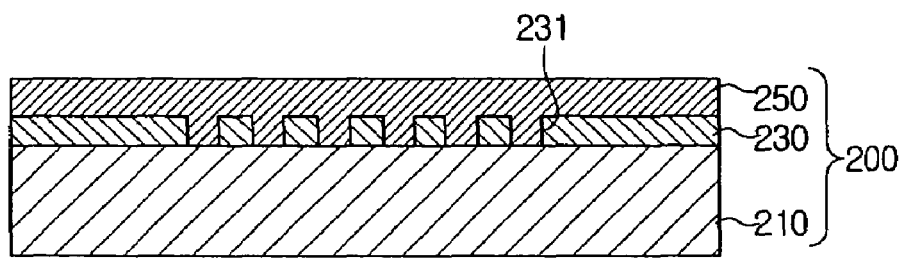

In FIG. 6C, a silicon layer 250 is formed on the oxide layer 230 having the electrifying hole 231 in such manner that the silicon layer 250 and the silicon substrate 210 are fluidly connected through the electrifying hole 231. Accordingly, the silicon layer 250 and the silicon substrate 210 can be electrically charged.

Figure 6D:
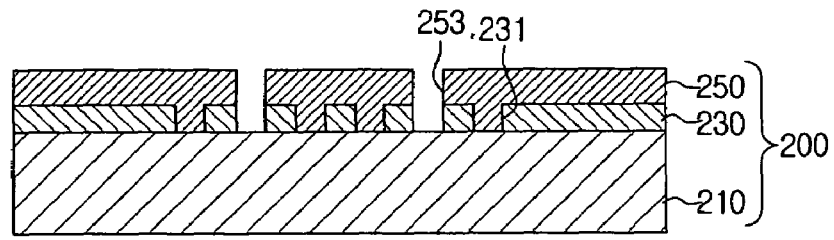

As shown in FIG. 6D, a predetermined pattern 253 for partly exposing the oxide layer 230 is formed in the silicon layer 250. The pattern 253 is etched using a deep reactive ion etching apparatus. Since the silicon layer 250 and the silicon substrate 210 are in fluid connection with each other through the electrifying hole 231, they can be electrically charged. Therefore, during reactive ion etching, electric charge is not concentrated on the interface between the pattern 253 and the oxide layer 230, thereby preventing generation of a notch.

Figure 6E:
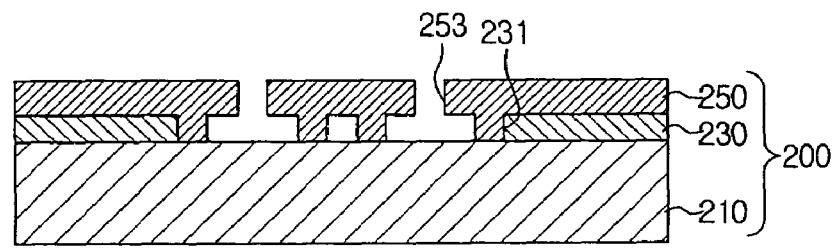

Referring to FIG. 6E, the oxide layer 230 disposed within an area for the etching pattern 253 is removed. The oxide layer 230 is removed by wet etching using a hydrofluoric acid solution.

Figure 6F:
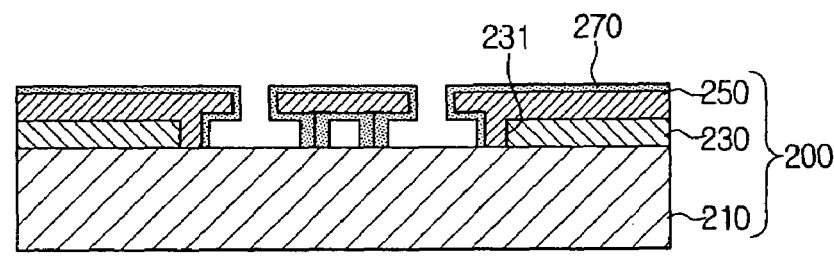

In FIG. 6F, an oxide layer 270, which may be a thermal oxide, is formed on a surface of the silicon layer 250.

The oxide layer 270 can be formed by oxidation in which oxygen chemically reacts with the surface of the silicon layer 250 (thermal oxide) or in which silicon dioxide is deposited, for example, from silane and oxygen or by decomposition of tetraethoxysilane in an LPCVD reactor on the surface of the silicon layer 250 at a temperature ranging from approximately 100~1200° C.

Figure 6G:
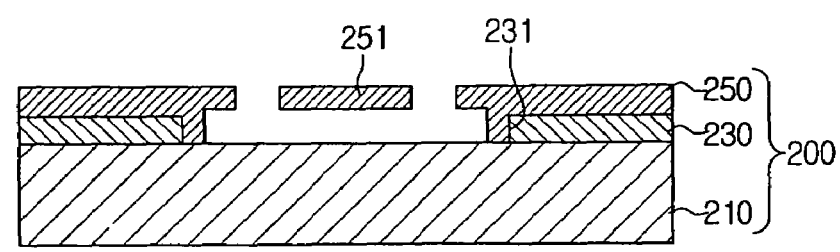

As shown in FIG. 6G, the oxide layer 270 is etched using an etching device, to thereby form the floating structure 251. The etching device performs wet etching for removal of the oxide layer 230 of FIG. 6E.

The floating structure fabricated as described above can be applied for use in a micro electro mechanical system (MEMS) structure such as a gyroscope, an optical mirror and a radio frequency (RF) switch.

While the invention has been shown and described with reference to certain embodiments thereof, it will be understood by those skilled in the art that various changes in form and detail may be made therein without departing from the spirit and scope of the invention as defined by the appended claims.

What is claimed is:

1. A silicon-on-insulator (SOI) substrate comprising:
   a substrate;
   an oxide layer formed on the substrate; and
   a silicon layer formed on the oxide layer; and
   means for preventing a notch from being generated when etching a pattern in said silicon layer.

2. A method for fabricating an SOI substrate, which comprises
   forming an oxide layer on a substrate;
   forming a silicon layer on the oxide layer including an electrification structure connecting the silicon layer to the substrate; and
   electrically connecting the silicon layer to the substrate using the electrification structure.

3. The method of claim 2, wherein the silicon layer forming step comprises exposing a part of the substrate to form an electrifying hole and filling the electrifying hole with a part of the silicon layer to form said electrification structure.

4. The method of claim 3, which comprises forming the electrifying hole by dry etching.

5. The method of claim 3, which comprises forming the electrifying hole by reactive ion etching.

6. A method for fabricating a floating structure using an SOI substrate, which comprises:
   depositing an oxide layer on a substrate in a predetermined thickness;
   forming a silicon layer on the oxide layer including an electrification structure;
   electrically connecting the silicon layer to the substrate using the electrification structure;
   forming a pattern for the floating structure on the silicon layer;
   removing the oxide layer corresponding to the inner area of the pattern;
   forming a second oxide layer on a surface of the silicon layer; and
   removing the second oxide layer to form said floating structure.

7. The method of claim 6, wherein the silicon layer forming step comprises exposing a part of the substrate to form an electrifying hole and filling the electrifying hole with a part of the silicon layer to form said electrification structure.

8. The method of claim 7, which comprises forming the electrifying hole within an area for the floating structure.

9. The method of claim 8, which comprises forming the electrifying hole by dry etching.

10. The method of claim 9, wherein said dry etching comprises reactive ion etching.

11. The method of claim 6, wherein the pattern forming step comprises forming the pattern by reactive ion etching.

12. The method of claim 6, wherein the step of removing the oxide layer corresponding to an inner area of the pattern comprises removing the oxide layer by wet etching.

13. The method of claim 6, wherein the step of forming the second oxide layer comprises forming the second oxide layer by oxidation.

14. The method of claim 6, wherein the step of forming the floating structure by removing the second oxide layer comprises removing the second oxide layer by wet etching.

15. The method of claim 6, wherein said second oxide layer is a thermal oxide layer.

* * * * *